(12) United States Patent
Masuda et al.

(10) Patent No.: US 9,679,986 B2
(45) Date of Patent: *Jun. 13, 2017

(54) SILICON CARBIDE SEMICONDUCTOR DEVICE

(71) Applicant: Sumitomo Electric Industries, Ltd., Osaka-shi (JP)

(72) Inventors: Takeyoshi Masuda, Osaka (JP); Yu Saitoh, Osaka (JP); Hideki Hayashi, Osaka (JP); Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/957,267

(22) Filed: Dec. 2, 2015

(65) Prior Publication Data

US 2016/0087065 A1    Mar. 24, 2016

Related U.S. Application Data

(63) Continuation of application No. 13/958,073, filed on Aug. 2, 2013, now abandoned.
(Continued)

(30) Foreign Application Priority Data

Sep. 12, 2012 (JP) ................. 2012-200179

(51) Int. Cl.
| H01L 29/51 | (2006.01) |
| H01L 29/66 | (2006.01) |
| H01L 29/423 | (2006.01) |
| H01L 21/04 | (2006.01) |
| H01L 29/78 | (2006.01) |
| H01L 29/16 | (2006.01) |
| H01L 29/04 | (2006.01) |

(52) U.S. Cl.
CPC ......... *H01L 29/513* (2013.01); *H01L 21/049* (2013.01); *H01L 29/1608* (2013.01);
(Continued)

(58) Field of Classification Search
None
See application file for complete search history.

(56) References Cited

U.S. PATENT DOCUMENTS 5,473,176 A    12/1995   Kakumoto
5,637,898 A    6/1997    Baliga
(Continued)

FOREIGN PATENT DOCUMENTS

CN       1360735 A      7/2002
CN       101238581 A    8/2008
(Continued)

OTHER PUBLICATIONS

H. Jansen et al., "A survey on the reactive ion etching of silicon in microtechnology," J. Micromech. Microeng. 6, (1996), pp. 14-28.
(Continued)

*Primary Examiner* — Mary Wilczewski
*Assistant Examiner* — Erik T Peterson
(74) *Attorney, Agent, or Firm* — Venable LLP; Michael A. Sartori; F. Brock Riggs

(57) ABSTRACT

A gate insulating film is provided on a trench. The gate insulating film has a trench insulating film and a bottom insulating film. The trench insulating film covers each of a side wall and a bottom portion. The bottom insulating film is provided on the bottom portion with a trench insulating film being interposed therebetween. The bottom insulating film has a carbon atom concentration lower than that of the trench insulating film. The gate electrode is in contact with a portion of the trench insulating film on the side wall. Accordingly, a low threshold voltage and a large breakdown voltage can be attained.

5 Claims, 13 Drawing Sheets

Related U.S. Application Data

(60) Provisional application No. 61/700,084, filed on Sep. 12, 2012.

(52) U.S. Cl.
CPC ...... *H01L 29/42368* (2013.01); *H01L 29/512* (2013.01); *H01L 29/517* (2013.01); *H01L 29/66068* (2013.01); *H01L 29/78* (2013.01); *H01L 29/7813* (2013.01); *H01L 29/045* (2013.01); *H01L 29/4236* (2013.01)

(56) References Cited

U.S. PATENT DOCUMENTS

| | | | |
|---|---|---|---|
| 5,744,826 | A | 4/1998 | Takeuchi et al. |
| 5,915,180 | A | 6/1999 | Hara et al. |
| 5,976,936 | A | 11/1999 | Miyajima et al. |
| 5,998,833 | A | 12/1999 | Baliga |
| 7,005,351 | B2 | 2/2006 | Henninger et al. |
| 7,648,877 | B2 | 1/2010 | Andrews |
| 2001/0052617 | A1 | 12/2001 | Kitada et al. |
| 2004/0031987 | A1 | 2/2004 | Henninger et al. |
| 2004/0089910 | A1 | 5/2004 | Hirler et al. |
| 2004/0180510 | A1 | 9/2004 | Ranade et al. |
| 2005/0167742 | A1 | 8/2005 | Challa et al. |
| 2006/0014349 | A1 | 1/2006 | Williams et al. |
| 2006/0166419 | A1 | 7/2006 | Shimoyama et al. |
| 2007/0037327 | A1 | 2/2007 | Herrick et al. |
| 2007/0138546 | A1 | 6/2007 | Kawamura et al. |
| 2007/0187695 | A1 | 8/2007 | Nakamura et al. |
| 2007/0190712 | A1 | 8/2007 | Lin et al. |
| 2008/0150015 | A1 | 6/2008 | Cho |
| 2009/0078995 | A1 | 3/2009 | Nakagawa et al. |
| 2009/0111231 | A1 | 4/2009 | Grebs et al. |
| 2009/0261420 | A1 | 10/2009 | Ryu et al. |
| 2009/0315083 | A1 | 12/2009 | Pan et al. |
| 2009/0321817 | A1 | 12/2009 | Hunt |
| 2010/0006928 | A1 | 1/2010 | Pan et al. |
| 2010/0019250 | A1 | 1/2010 | Nakamura et al. |
| 2010/0065904 | A1 | 3/2010 | Pan et al. |
| 2010/0184095 | A1 | 7/2010 | Haketa et al. |
| 2010/0193799 | A1 | 8/2010 | Nakano et al. |
| 2010/0314626 | A1 | 12/2010 | Harada et al. |
| 2010/0320534 | A1 | 12/2010 | Pan et al. |
| 2011/0068353 | A1 | 3/2011 | Nakano |
| 2011/0136309 | A1 | 6/2011 | Grivna et al. |
| 2011/0136310 | A1 | 6/2011 | Grivna |
| 2011/0303975 | A1 | 12/2011 | Yilmaz et al. |
| 2012/0025304 | A1 | 2/2012 | Blank et al. |
| 2012/0049202 | A1 | 3/2012 | Nakano |
| 2012/0184095 | A1 | 7/2012 | Poelzl |
| 2012/0217577 | A1 | 8/2012 | Hashimoto et al. |
| 2012/0228640 | A1 | 9/2012 | Masuda et al. |
| 2012/0235229 | A1 | 9/2012 | Probst |

FOREIGN PATENT DOCUMENTS

| | | |
|---|---|---|
| CN | 101558499 A | 10/2009 |
| JP | H07122749 A | 5/1995 |
| JP | 07-326755 A | 12/1995 |
| JP | 2003-318392 A | 11/2003 |
| JP | 2006-203007 A | 8/2006 |
| JP | 2007-194283 A | 8/2007 |
| JP | 2009-505403 A | 2/2009 |
| JP | 2009-224365 A | 10/2009 |
| JP | 2010-129820 A | 6/2010 |
| JP | 2010-263104 A | 11/2010 |
| JP | 2011-216783 A | 10/2011 |
| JP | 2012-038771 A | 2/2012 |
| WO | WO-00/72372 A1 | 11/2000 |
| WO | WO-2007/001988 A2 | 1/2007 |
| WO | WO-2009/142233 A1 | 11/2009 |
| WO | WO-2012/098861 A1 | 7/2012 |
| WO | WO-2012/105170 A1 | 8/2012 |

OTHER PUBLICATIONS

Y. Song et al., "Modified Deal Grove model for the thermal oxidation of silicon carbide," Journal of Applied Physics 95, (2004), pp. 4953-4957.
International Search Report and Written Opinion in PCT International Application No. PCT/JP2013/068399, dated Oct. 8, 2013.
International Search Report and Written Opinion in PCT International Application No. PCT/JP2013/068400, dated Oct. 8, 2013.
Office Action in U.S. Appl. No. 13/958,151, dated Oct. 9, 2013.
International Search Report and Written Opinion in PCT International Application No. PCT/JP2013/070575, dated Nov. 5, 2013.
Vathulya et al., "On the correlation between the carbon content and the electrical quality of thermally grown oxides on p-type 6H-silicon carbide," Applied Physics Letters, vol. 73, pp. 2161-2163, (1998).
Office Action in U.S. Appl. No. 13/958,151 dated May 5, 2014.
Office Action in U.S. Appl. No. 13/958,115, dated May 9, 2014.
T. Nakamura et al., "High Performance SiC Trench Devices with Ultra-low Ron," IEEE Electron Devices Meeting (IEDM), 2011, pp. 26.5.1-26.5.3.
Chang et al., "Nanoscale Characterization of the Silicon Dioxide-Silicon Carbide Interface Using Elemental Mapping by Energy-Filtered Transmission Electron Microscopy", Journal Electronic Materials, vol. 32, No. 5, 2003, pp. 464-469.
Poggi et al., "Characterization of a thermal oxidation process on SiC preamorphized by Ar ion implantation", Materials Science Forum, vols. 457-460 (2004), pp. 1357-1360.
Chaudhry et al., "A study of native oxides of beta-SiC using Auger electron spectroscopy," J. Mater. Res., vol. 4, No. 2, Mar./Apr. 1989, pp. 404-407.
Akashi et al., "SIMS study of SiC single crystal oxidized in atmosphere containing isotopic water vapor," Journal of the Ceramic Society of Japan, vol. 116, No. 1357, (2008) pp. 960-964.
Lu et al., "Thermal Oxidation of Sputtered Silicon Carbide Thin Films", J. Electrochem. Soc. 1984, vol. 131, Issue 8, pp. 1907-1914.
Chang et al., "High-carbon concentrations at the silicon dioxide-silicon carbide interface identified by electron energy loss spectroscopy," Appl. Phys. Lett. 77, 2000, pp. 2186-2188.
Hijikata et al., "Composition analysis of SiO2/SiC interfaces by electron spectroscopic measurements using slope-shaped oxide films," Applied Surface Science, vol. 184, 2001, pp. 161-166.
Advisory Action in U.S. Appl. No. 13/958,073, dated May 11, 2015.
Saitoh et al., U.S. Appl. No. 13/958,151, filed Aug. 2, 2013.
Masuda et al., U.S. Appl. No. 13/958,073, filed Aug. 2, 2013.
Office Action in U.S. Appl. No. 13/958,073, dated May 6, 2014.
Decision to Grant Patent in Japanese Patent Application No. 2012-200178, dated Aug. 25, 2015.
Notice of Grounds of Rejection in Japanese Patent Application No. 2012-200179, dated Aug. 25, 2015.
Hayashi et al., U.S. Appl. No. 13/958,115, filed Aug. 2, 2013.
Office Action in U.S. Appl. No. 13/958,073, dated Nov. 17, 2014.
Notification of First Office Action in Chinese Patent Application No. 201380040551.4, dated Aug. 2, 2016.
Notification of First Office Action in counterpart Chinese Patent Application No. 201380042640.2, dated Aug. 22, 2016.
Notice of Grounds of Rejection in counterpart Japanese Patent Application No. 2012-200179, dated Oct. 11, 2016.
Extended European Search Report in European Patent Application No. 13836438.5, dated Apr. 20, 2016.
Extended European Search Report in European Patent Application No. 13836826.1, dated Apr. 20, 2016.
Extended European Search Report in European Patent Application No. 13836475.7, dated May 2, 2016.
Notice of Grounds of Rejection in Japanese Patent Application No. 2012-200179, dated Apr. 5, 2016.
Notice of Grounds of Rejection in Japanese Patent Application No. 2012-200180, dated May 17, 2016.
Ueno, "Orientation Dependence of the Oxidation of SiC Surfaces," Physica Status Solidi (A). Appled Research, vol. 162, No. 1, Jul. 1, 1997.

(11-20)
(01-10)

(0-11-2)

SILICON CARBIDE SEMICONDUCTOR DEVICE

CROSS REFERENCE TO RELATED APPLICATIONS

This application is a Continuation of U.S. patent application Ser. No. 13/958,073, filed Aug. 2, 2013, which claims the benefit of U.S. Provisional Application No. 61/700,084, filed Sep. 12, 2012 and Japanese Patent Application No. 2012-200179, filed Sep. 12, 2012.

BACKGROUND OF THE INVENTION

Field of the Invention

The present invention relates to a silicon carbide semiconductor device, in particular, a silicon carbide semiconductor device having a trench.

Description of the Background Art

Japanese Patent Laying-Open No. 7-326755 discloses a trench gate type MOSFET (Metal Oxide Semiconductor Field Effect Transistor) employing a silicon carbide substrate. This patent publication describes that a gate thermal oxidation film has a thicker film thickness on a bottom surface of a trench than the film thickness thereof on a side surface of the trench, so that a threshold voltage becomes low and breakdown voltage between the gate and the drain becomes high. It is also described that the bottom surface of the trench corresponds to a carbon plane, which allows for fast oxidation rate, of hexagonal single-crystal silicon carbide, whereas the side surface of the trench corresponds to a plane perpendicular to this carbon plane and allowing for slow oxidation rate. Hence, by performing a thermal oxidation process once, a thermal oxidation film can be formed such that the thickness of the thermal oxidation film on the side surface of the trench is greatly different from the thickness of the thermal oxidation film on the bottom surface of the trench.

According to the technique of the above-described patent publication, the gate insulating film on the trench is entirely formed by the thermal oxidation on the trench of the silicon carbide substrate. The silicon carbide substrate used here normally has a high crystallinity, so that a thin and flat gate insulating film can be formed. In this way, low threshold voltage can be attained. However, in the insulating film thus formed by the thermal oxidation of silicon carbide, carbon atoms, which have existed in the silicon carbide, remains to an extent that cannot be disregarded. According to a study conducted by the present inventors, the carbon atoms remaining in the gate oxide film decrease dielectric breakdown resistance of the gate insulating film. Accordingly, it is considered that there is room for further improvement for the dielectric breakdown resistance in the above-described conventional technique. Namely, it is considered that there is room for further increasing the breakdown voltage of the silicon carbide semiconductor device.

SUMMARY OF THE INVENTION

The present invention has been made to solve the foregoing problem and has its object to provide a silicon carbide semiconductor device having a low threshold voltage and a large breakdown voltage.

A silicon carbide semiconductor device of the present invention includes: a silicon carbide substrate, a gate insulating film, and a gate electrode. The silicon carbide substrate includes first to third layers. The first layer has first conductivity type. The second layer is provided on the first layer and has second conductivity type. The third layer is provided on the second layer, is separated from the first layer by the second layer, and has the first conductivity type. The silicon carbide substrate is provided with a trench. The trench includes a side wall and a bottom portion, the side wall extending through the third layer and the second layer and reaching the first layer, the bottom portion being formed of the first layer. The gate insulating film is provided on the trench. The gate insulating film includes a trench insulating film and a bottom insulating film. The trench insulating film covers each of the side wall and the bottom portion. The bottom insulating film is provided on the bottom portion with the trench insulating film being interposed therebetween. The bottom insulating film has a carbon atom concentration lower than that of the trench insulating film. The gate electrode is provided in the trench. The gate electrode is in contact with a portion of the trench insulating film on the side wall.

According to this silicon carbide semiconductor device, electric insulation between the gate electrode and the bottom portion of the trench is secured by the bottom insulating film in addition to the trench insulating film. With the low carbon atom concentration, the bottom insulating film has a high dielectric breakdown resistance. Accordingly, the silicon carbide semiconductor device has a large breakdown voltage. Further, according to the silicon carbide semiconductor device, the gate electrode is in contact with the portion of the trench insulating film on the side wall. Namely, the gate electrode faces the side wall that forms a channel, without the bottom insulating film being interposed therebetween. Thus, the bottom insulating film is disposed so as not to increase the threshold voltage. Accordingly, a low threshold voltage is attained without influence of the bottom insulating film.

Preferably, a total of a thickness of the trench insulating film on the bottom portion and a thickness of the bottom insulating film is larger than a thickness of the trench insulating film on the side wall. Accordingly, the thickness of the gate insulating film can be made small on the side wall whereas the thickness thereof can be made large on the bottom portion. Accordingly, the breakdown voltage of the silicon carbide semiconductor device can be made larger while making the threshold voltage small.

Preferably, on the bottom portion, a thickness of the bottom insulating film is larger than that of the trench insulating film. Accordingly, a ratio of the portion formed of the bottom insulating film of the gate insulating film is made large on the bottom portion. This leads to a larger breakdown voltage of the silicon carbide semiconductor device.

Preferably, a thickness of the trench insulating film on the bottom portion is smaller than a thickness of the trench insulating film on the side wall. Accordingly, a region for providing the bottom insulating film is further secured on the bottom portion. This leads to a larger breakdown voltage of the silicon carbide semiconductor device.

Preferably, the carbon atom concentration of the trench insulating film is more than $1\times10^{15}$ $cm^{-3}$, and the carbon atom concentration of the bottom insulating film is less than $1\times10^{15}$ $cm^3$. Accordingly, the carbon atom concentration in the bottom insulating film is sufficiently made low. This leads to a larger breakdown voltage of the silicon carbide semiconductor device.

Preferably, the bottom insulating film has a thickness of more than 100 nm. This leads to a larger breakdown voltage of the silicon carbide semiconductor device.

Preferably, the trench insulating film is a thermal oxidation film of silicon carbide. This makes the trench insulating film thin and smooth. This leads to a larger breakdown voltage of the silicon carbide semiconductor device.

Preferably, the bottom insulating film is formed of at least any one of silicon oxide, silicon nitride, and phosphorus silicate glass. This leads to a larger breakdown voltage of the silicon carbide semiconductor device.

Preferably, the bottom insulating film is a thermal oxidation film of a film containing silicon and containing no carbon. This leads to a larger breakdown voltage of the silicon carbide semiconductor device.

As described above, according to the present invention, a low threshold voltage and a large breakdown voltage are attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
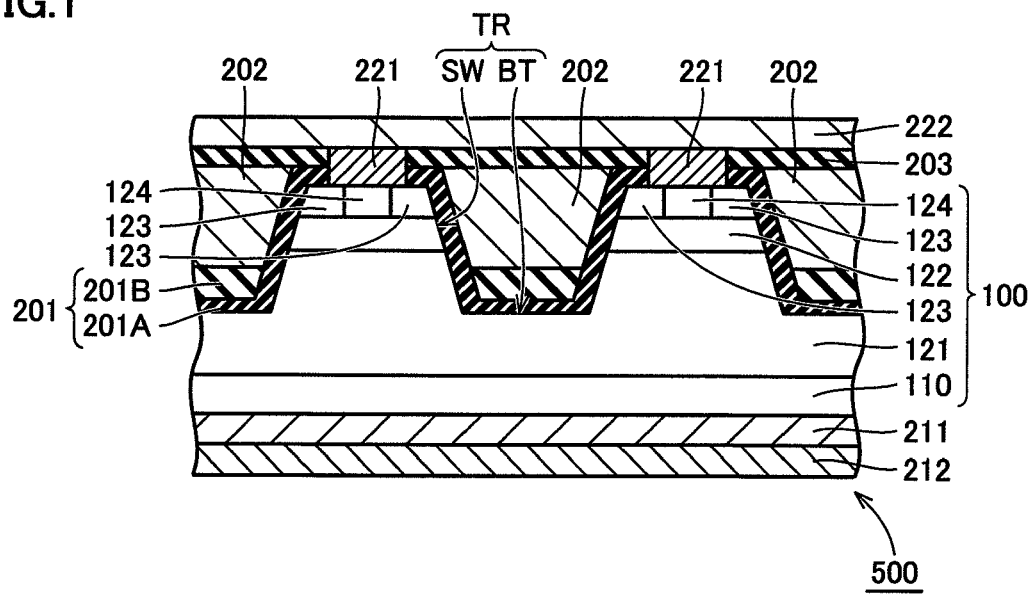
FIG. 1 is a partial cross sectional view schematically showing a configuration of a silicon carbide semiconductor device in a first embodiment of the present invention.

The following describes embodiments of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "–" (bar) above a numeral, but is expressed by putting the negative sign before the numeral in the present specification.

First Embodiment

As shown in FIG. 1, a vertical type MOSFET 500 (silicon carbide semiconductor device) of the present embodiment includes an epitaxial substrate 100 (silicon carbide substrate), gate insulating films 201, gate electrodes 202, interlayer insulating films 203, source electrodes 221, a drain electrode 211, a source interconnection 222, and a protecting electrode 212.

Epitaxial substrate 100 is made of silicon carbide, and has a single-crystal substrate 110 and an epitaxial layer provided thereon. The epitaxial layer includes an n⁻ layer 121 (first layer), p type body layers 122 (second layer), n regions 123

(third layer), and contact regions 124. The silicon carbide of epitaxial substrate 100 preferably has a hexagonal crystal structure, more preferably, has a polytype of 4H.

Single-crystal substrate 110 has n type (first conductivity type) conductivity. The plane orientation (hklm) of one main surface (upper surface in FIG. 1) of single-crystal substrate 110 preferably has m of negative value, more preferably, corresponds to approximately a (000-1) plane.

N⁻ layer 121 has a donor added therein and therefore has n type conductivity. The donor is preferably added to n⁻ layer 121 by adding an impurity during epitaxial growth of n⁻ layer 121, rather than ion implantation. N⁻ layer 121 preferably has a donor concentration lower than that of single-crystal substrate 110. N⁻ layer 121 preferably has a donor concentration of not less than $1\times10^{15}$ cm$^{-3}$ and not more than $5\times10^{16}$ cm$^{-3}$, for example, has a donor concentration of $8\times10^{15}$ cm$^{-3}$.

Each of p type body layers 122 is provided on n⁻ layer 121, has an acceptor added therein, and therefore has p type conductivity (second conductivity type). P type body layer 122 has an acceptor concentration of, for example, $1\times10^{18}$ cm$^{-3}$.

Each of n regions 123 has n type conductivity. N region 123 is provided on p type body layer 122, and is separated from n⁻ layer 121 by p type body layer 122. Contact region 124 has p type conductivity. Contact region 124 is formed on a portion of p type body layer 122 so as to be connected to p type body layer 122.

Figure 2:
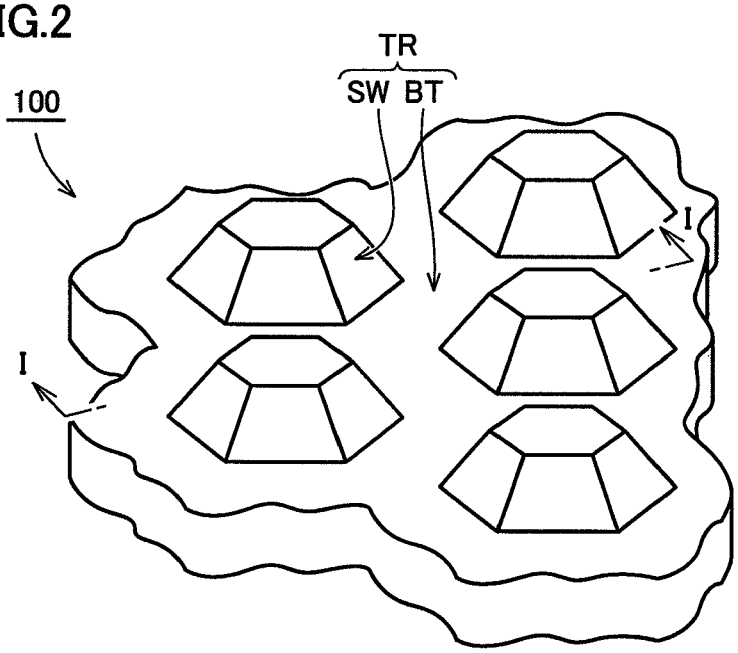
FIG. 2 is a perspective view schematically showing a shape of a silicon carbide substrate included in the silicon carbide semiconductor device of FIG. 1.
Figure 3:
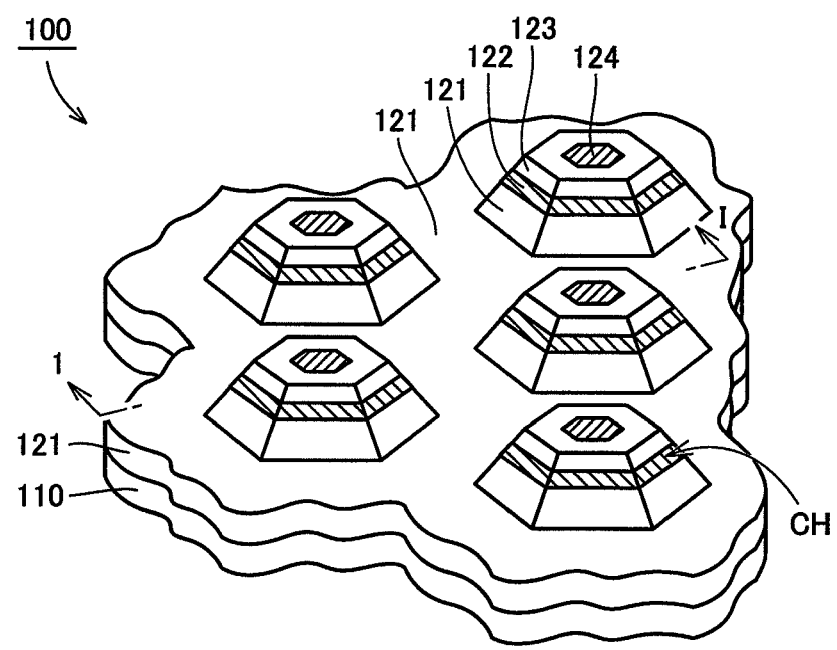
FIG. 3 shows the configuration of FIG. 2 more in detail with a region of second conductivity type being provided with hatching for viewability of the figure.

Further, referring to FIG. 2 and FIG. 3, epitaxial substrate 100 is provided with a trench TR. Trench TR has side walls SW and a bottom portion BT. Each of side walls SW extends through n region 123 and p type body layer 122 and reaches n⁻ layer 121. Bottom portion BT is formed of n⁻ layer 121. Side wall SW has a channel surface CH on p type body layer 122 (FIG. 3). Bottom portion BT is a flat surface substantially parallel to the main surface of epitaxial substrate 100. Preferably, side wall SW has a predetermined crystal plane (also referred to as "special plane") particularly on p type body layer 122. Details of the special plane will be described later.

The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has upper surface and bottom portion both having a hexagonal shape, and has side walls inclined relative to the main surface of single-crystal substrate 110. Thus, trench TR expands toward the opening in a tapering manner.

Gate insulating film 201 is provided on trench TR. Gate insulating film 201 separates epitaxial substrate 100 and gate electrode 202 from each other in trench TR. Gate insulating film 201 has a trench insulating film 201A and a bottom insulating film 201B. Trench insulating film 201A covers each of side walls SW and bottom portion BT. Bottom insulating film 201B is provided on bottom portion BT with trench insulating film 201A being interposed therebetween. Bottom insulating film 201B has a portion located at a corner portion formed by bottom portion BT and each side wall SW.

Bottom insulating film 201B has a carbon atom concentration lower than that of trench insulating film 201A. Preferably, trench insulating film 201A is a thermal oxidation film of silicon carbide. In this case, trench insulating film 201A is made of silicon oxide containing carbon atoms as an impurity. Preferably, bottom insulating film 201B is a thermal oxidation film of a film containing silicon and containing no carbon. In the present embodiment, bottom insulating film 201B is a thermal oxidation film of a silicon film, and is made of silicon oxide.

Figure 4:
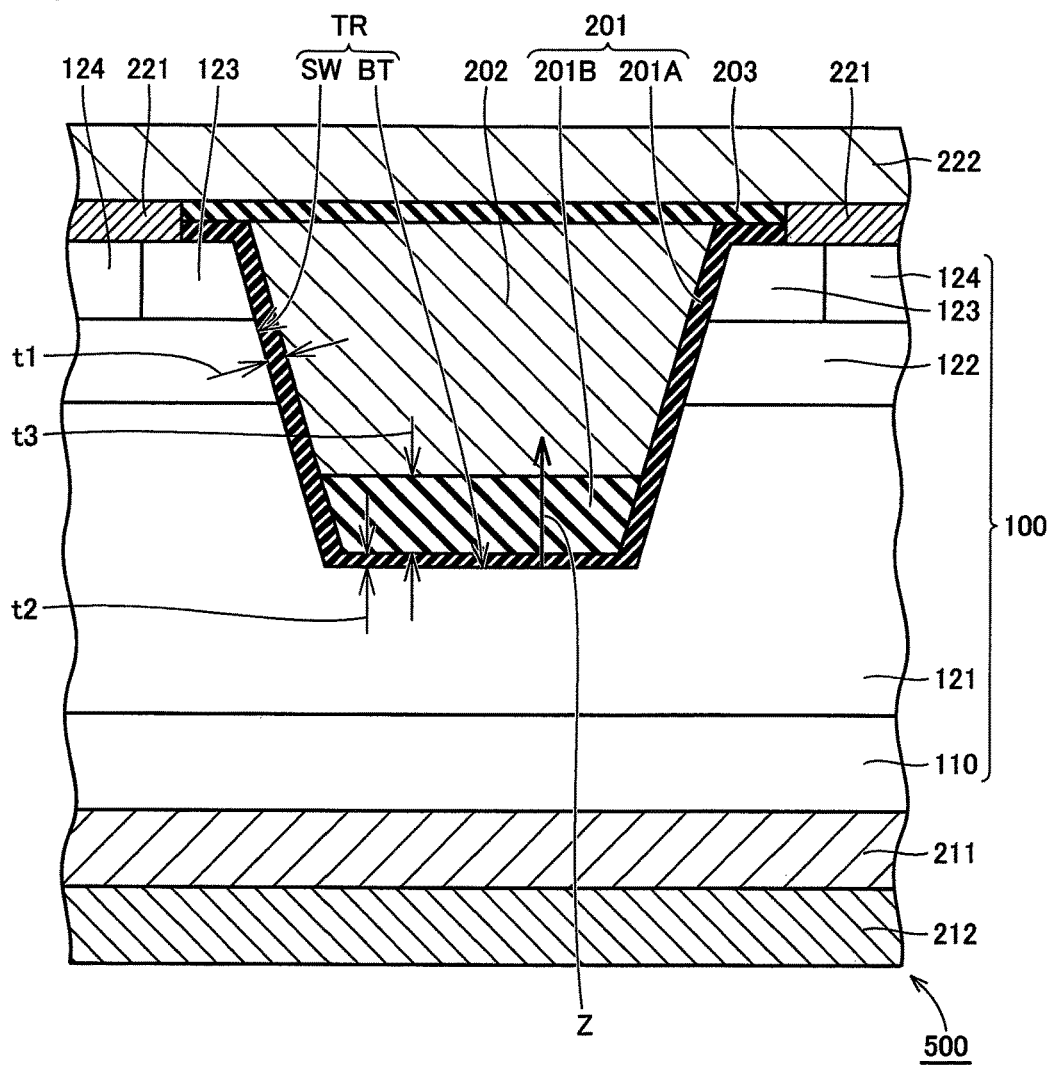
FIG. 4 is an enlarged view of FIG. 1.

As shown in FIG. 4, trench insulating film 201A has a thickness t1 on side wall SW and has a thickness t2 on bottom portion BT. Bottom insulating film 201B has a thickness t3 on bottom portion BT. Preferably, a total of thickness t2 and thickness t3 is larger than thickness t1. Preferably, thickness t3 is larger than thickness t2. Preferably, thickness t2 is smaller than thickness t1. Preferably, thickness t3 is larger than 100 nm.

Trench insulating film 201A may have a carbon atom concentration of more than $1\times10^{15}$ cm$^{-3}$. Bottom insulating film 201B preferably has a carbon atom concentration of less than $1\times10^{15}$ cm$^{-3}$. It should be noted that in the case where the carbon atom concentrations are not uniform, an average value may be calculated.

Figure 5:
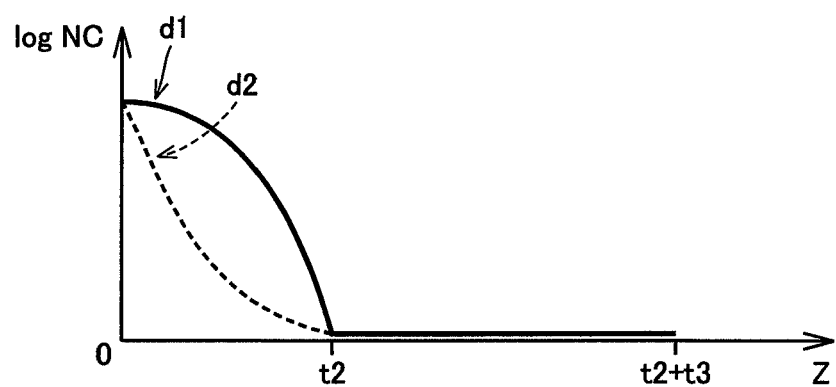
FIG. 5 is a graph showing a profile of a carbon atom concentration along an arrow Z in FIG. 4.

Further, referring to FIG. 5, a solid line of FIG. 5 illustrates a profile of a carbon atom concentration NC in the thickness direction (arrow Z in FIG. 4) from the bottom portion BT toward the trench. A location Z=0 corresponds to an interface between bottom portion BT and trench insulating film 201A. A location Z=t2 corresponds to an interface between trench insulating film 201A and bottom insulating film 201B. A location Z=t2+t3 corresponds to an interface between bottom insulating film 201B and gate electrode 202. When 0<Z<t2, carbon atom concentration NC becomes smaller as Z increases. In the vicinity of Z=0 (arrow d1 in the figure), the decrease of carbon atom concentration NC is relatively gradual. When Z>t2, carbon atom concentration NC substantially reaches or falls below the detection limit. In the vicinity of location Z=0, trench insulating film 201A typically has a carbon atom concentration NC of more than approximately $1\times10^{17}$ cm$^{-3}$ and less than approximately $1\times10^{20}$ cm$^{-3}$, for example, has a carbon atom concentration NC of approximately $1\times10^{18}$ cm$^{-3}$.

Gate electrode 202 is provided in trench TR. Specifically, gate electrode 202 is buried in trench TR with gate insulating film 201 interposed therebetween. Gate electrode 202 is in contact with trench insulating film 201A at a portion located on side wall SW. On side wall SW, gate electrode 202 faces the surface of p type body layer 122 with only trench insulating film 201A being interposed therebetween. In other words, bottom insulating film 201B is not provided between the portion of trench insulating film 201A on side wall SW and gate electrode 202. Gate electrode 202 has an upper surface substantially as high as the upper surface of a portion of gate insulating film 201 on the upper surface of n region 123. Interlayer insulating film 203 is provided to cover gate electrode 202 as well as the extended portion of gate insulating film 201 on the upper surface of n region 123.

Source electrode 221 extends through interlayer insulating film 203 and makes contact with each of n regions 123 and contact region 124. Source interconnection 222 is provided on source electrode 221 and interlayer insulating film 203 in contact with source electrode 221. Drain electrode 211 is provided on an opposite surface of epitaxial substrate 100 to its surface in which trench TR is provided. Protecting electrode 212 covers drain electrode 211.

The following describes a method for manufacturing MOSFET 500 (FIG. 1).

Figure 6:
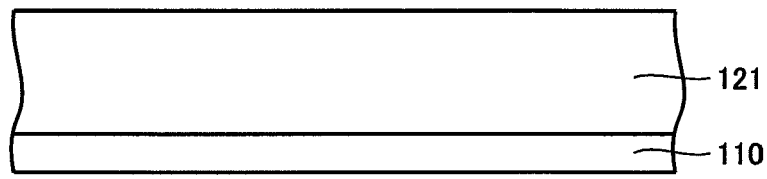
FIG. 6 is a partial cross sectional view schematically showing a first step of a method for manufacturing the silicon carbide semiconductor device of FIG. 1.

As shown in FIG. 6, on single-crystal substrate 110, n⁻ layer 121 is formed by means of epitaxial growth. This epitaxial growth can be performed by means of, for example, a CVD (Chemical Vapor Deposition) method in which a mixed gas of silane (SiH$_4$) and propane (C$_3$H$_8$) is used as a source material gas and hydrogen gas (H$_2$) is used as a carrier gas, for example. In doing so, it is preferable to introduce nitrogen (N) or phosphorus (P) as a donor, for example.

Figure 7:
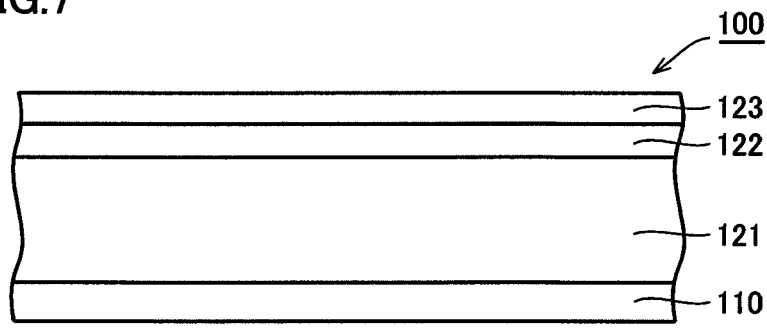
FIG. 7 is a partial cross sectional view schematically showing a second step of the method for manufacturing the silicon carbide semiconductor device of FIG. 1.

As shown in FIG. 7, p type body layer 122 is formed on n⁻ layer 121, and n region 123 is formed on p type body layer 122. Specifically, ion implantation is performed into the upper surface of n⁻ layer 121. In the ion implantation for forming p type body layer 122, ions of an acceptor such as aluminum (Al) are implanted. Meanwhile, in the ion implantation for forming n region 123, ions of a donor such as phosphorus (P) are implanted, for example. Accordingly, epitaxial substrate 100 is formed which has n⁻ layer 121, p type body layer 122, and n region 123. It should be noted that instead of the ion implantation, epitaxial growth involving addition of impurities may be employed.

Figure 8:
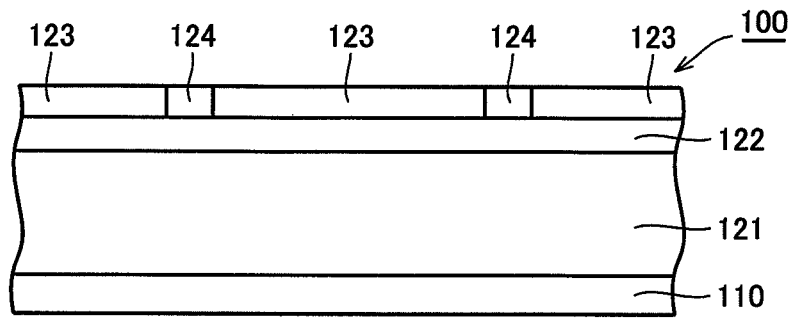
FIG. 8 is a partial cross sectional view schematically showing a third step of the method for manufacturing the silicon carbide semiconductor device of FIG. 1.

As shown in FIG. 8, by means of the ion implantation, contact regions 124 are formed. Next, activation heating treatment is performed to activate the impurities added by the ion implantation. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Figure 9:
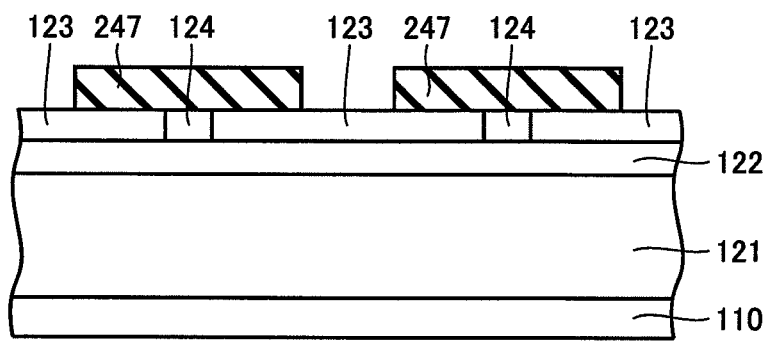
FIG. 9 is a partial cross sectional view schematically showing a fourth step of the method for manufacturing the silicon carbide semiconductor device of FIG. 1.

Next, a mask 247 (FIG. 9) having an opening through which n region 123 is partially exposed is formed on epitaxial substrate 100. The opening is formed to correspond to the location of trench TR (FIG. 1). As mask 247, a silicon oxide film formed through thermal oxidation can be used, for example.

Figure 10:
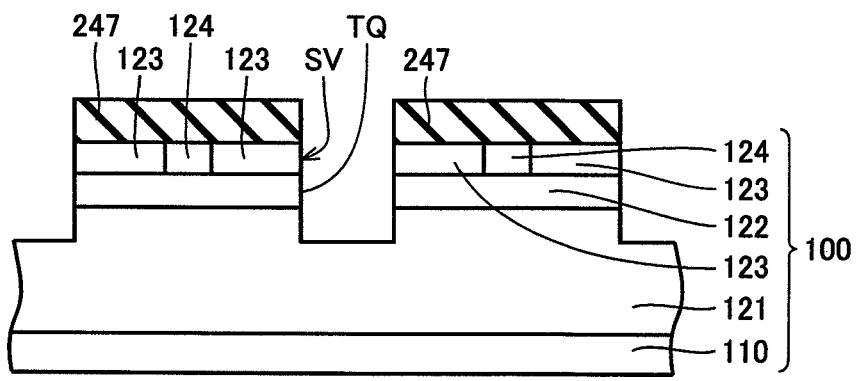
FIG. 10 is a partial cross sectional view schematically showing a fifth step of the method for manufacturing the silicon carbide semiconductor device of FIG. 1.

As shown in FIG. 10, in the opening of mask 247, n region 123, p type body layer 122, and a portion of n⁻ layer 121 are removed by etching. An exemplary, usable etching method is reactive ion etching (RIE), in particular, inductively coupled plasma (ICP) RIE. Specifically, ICP-RIE can be employed in which SF$_6$ or a mixed gas of SF$_6$ and O$_2$ is used as the reactive gas, for example. By means of such etching, in the region where trench TR (FIG. 1) is to be formed, a recess TQ can be formed which has a side wall having an inner surface SV substantially perpendicular to the main surface of single-crystal substrate 110.

Next, using mask 247, epitaxial substrate 100 is etched. Specifically, inner surface SV of recess TQ of epitaxial substrate 100 is thermally etched. The thermal etching can be performed by, for example, heating epitaxial substrate 100 in an atmosphere including a reactive gas containing at least one or more types of halogen atom. The at least one or more types of halogen atom include at least one of chlorine (Cl) atom and fluorine (F) atom. This atmosphere is, for example, Cl$_2$, BCL$_3$, SF$_6$, or CF$_4$. For example, the thermal etching is performed using a mixed gas of chlorine gas and oxygen gas as a reactive gas, at a heat treatment temperature of, for example, not less than 700° C. and not more than 1000° C.

Figure 11:
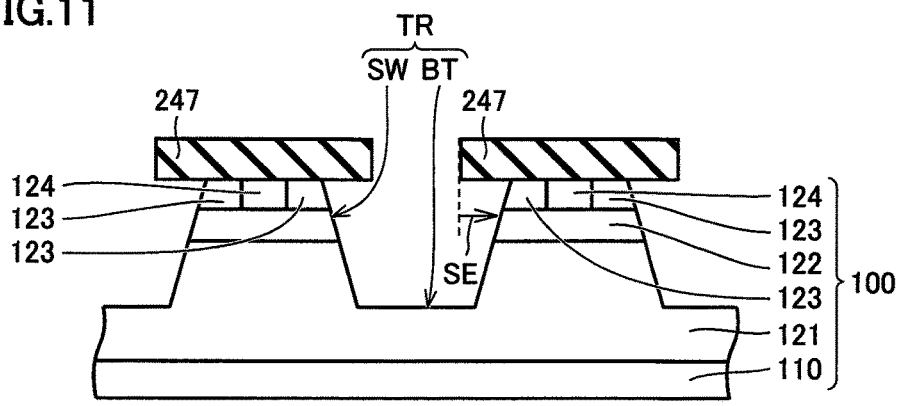
FIG. 11 is a partial cross sectional view schematically showing a sixth step of the method for manufacturing the silicon carbide semiconductor device of FIG. 1.

As a result of the thermal etching, trench TR is formed as shown in FIG. 11. During the formation of trench TR, epitaxial substrate 100 is etched in a side etching manner from the opening of mask 247 as indicated by an arrow SE. Further, during this thermal etching, a special plane is spontaneously formed in side wall SW of trench TR, in particular, its portion formed of p type body layer 122.

It should be noted that the reactive gas may contain a carrier gas in addition to the chlorine gas and the oxygen gas. An exemplary, usable carrier gas is nitrogen (N$_2$) gas, argon gas, helium gas, or the like. When the heat treatment temperature is set at not less than 700° C. and not more than 1000° C. as described above, a rate of etching SiC is approximately, for example, 70 μm/hour. In addition, in this case, mask 247, which is formed of silicon oxide and therefore has a very large selection ratio relative to SiC, is not substantially etched during the etching of SiC.

Figure 12:
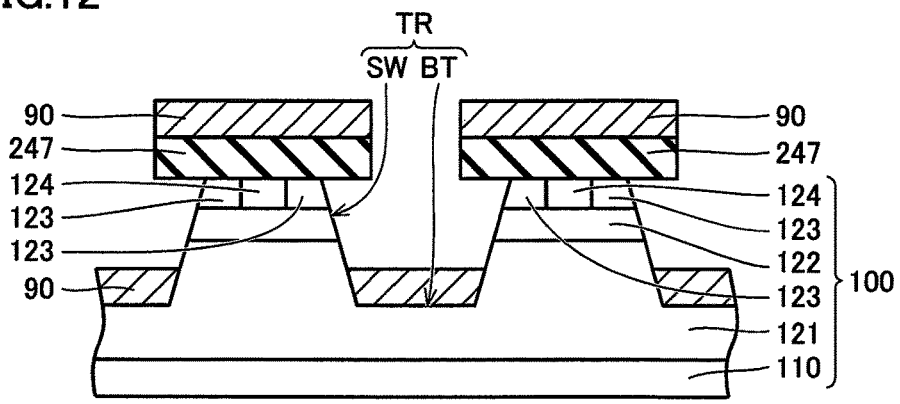
FIG. 12 is a partial cross sectional view schematically showing a seventh step of the method for manufacturing the silicon carbide semiconductor device of FIG. 1.
Figure 13:
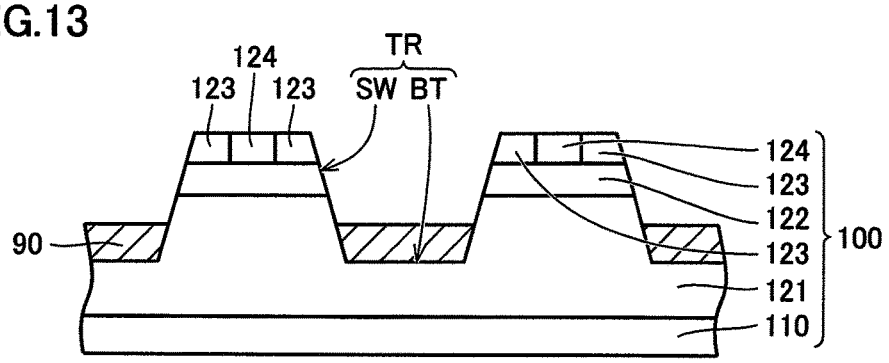
FIG. 13 is a partial cross sectional view schematically showing an eighth step of the method for manufacturing the silicon carbide semiconductor device of FIG. 1.

As shown in FIG. 12, a silicon film 90 is formed on epitaxial substrate 100 having mask 247 provided thereon. In other words, silicon film 90 is formed while using mask 247. Silicon film 90 is formed on bottom portion BT of trench TR. This formation can be performed by means of, for example, the CVD method. Next, mask 247 is removed by means of an appropriate method such as etching (FIG. 13). In doing so, the portion of silicon film 90 on mask 247 is also removed.

Next, oxidation is performed in trench TR, thereby forming gate insulating film 201 (FIG. 1) on trench TR. Specifically, the following steps are performed. First, silicon film 90 (FIG. 13) is thermally oxidized. Accordingly, an silicon oxide film is formed (FIG. 14) which serves as bottom insulating film 201B that forms a portion of gate insulating film 201 (FIG. 1). Silicon film 90 is thermally oxidized at, for example, not less than 800° C. and not more than 950° C. Next, as shown in FIG. 15, epitaxial substrate 100 made of silicon carbide is thermally oxidized, thereby forming an silicon oxide film serving as trench insulating film 201A of gate insulating film 201. Epitaxial substrate 100 is preferably thermally oxidized at a temperature higher than the temperature at which silicon film 90 is thermally oxidized, for example, is thermally oxidized at 1300° C. or more.

Figure 16:
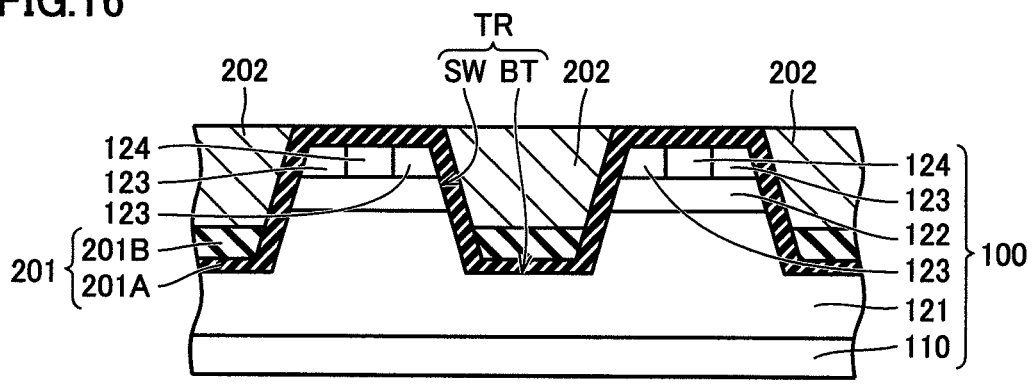
FIG. 16 is a partial cross sectional view schematically showing an eleventh step of the method for manufacturing the silicon carbide semiconductor device of FIG. 1.

As shown in FIG. 16, gate electrode 202 is formed on gate insulating film 201. Gate electrode 202 is formed in direct contact with trench insulating film 201A on p type body layer 122. A method for forming gate electrode 202 can be performed by, for example, forming a film of conductor or doped polysilicon and performing CMP (Chemical Mechanical Polishing).

Figure 17:
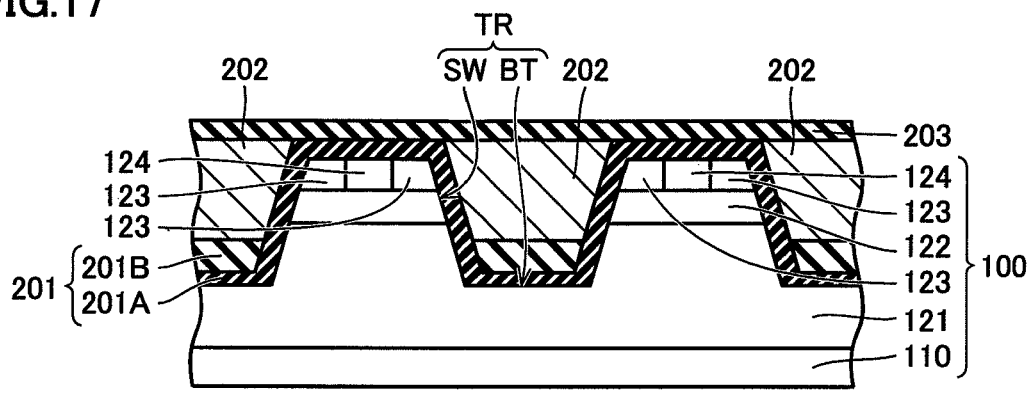
FIG. 17 is a partial cross sectional view schematically showing a twelfth step of the method for manufacturing the silicon carbide semiconductor device of FIG. 1.
Figure 18:
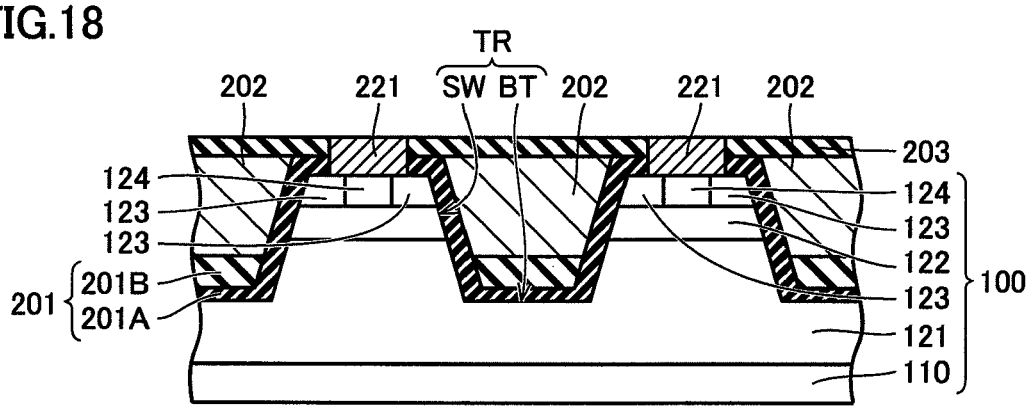
FIG. 18 is a partial cross sectional view schematically showing a thirteenth step of the method for manufacturing the silicon carbide semiconductor device of FIG. 1.

As shown in FIG. 17, interlayer insulating film 203 is formed on gate electrode 202 and gate insulating film 201 so as to cover the exposed surface of gate electrode 202. Referring to FIG. 18, etching is performed to form openings in interlayer insulating film 203 and gate insulating film 201. Through the opening, each of n region 123 and contact region 124 is exposed on the upper surface of the mesa structure. Next, on the upper surface of the mesa structure, source electrode 221 is formed in contact with each of n region 123 and contact region 124. Referring to FIG. 1 again, source interconnection 222, drain electrode 211, and protecting electrode 212 are formed. In this way, MOSFET 500 is obtained.

According to MOSFET 500 (FIG. 4) of the present embodiment, electric insulation between gate electrode 202 and bottom portion BT of trench TR is secured by bottom insulating film 201B in addition to trench insulating film 201A. Bottom insulating film 201B has a low carbon atom concentration, and therefore has a high dielectric breakdown resistance. Accordingly, MOSFET 500 has a large breakdown voltage. Further, according to this MOSFET 500, gate electrode 202 is in contact with the portion of trench insulating film 201A on side wall SW. Namely, gate electrode 202 faces side wall SW that forms a channel, without bottom insulating film 201B being interposed therebetween. Thus, bottom insulating film 201B is disposed so as not to increase the threshold voltage. Accordingly, a low threshold voltage is attained without influence of bottom insulating film 201B.

Figure 14:
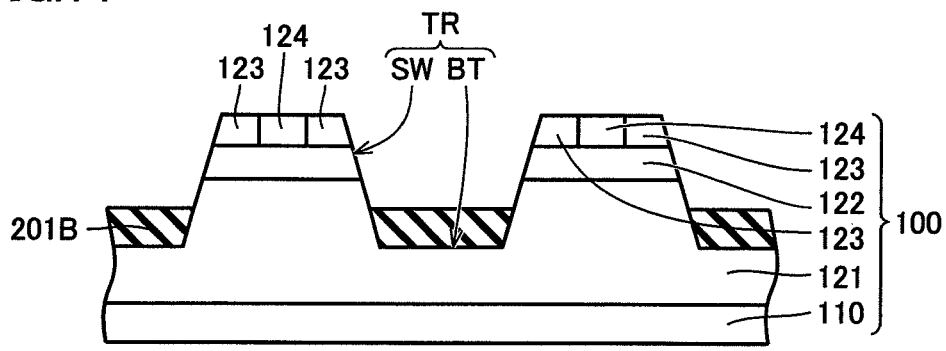
FIG. 14 is a partial cross sectional view schematically showing a ninth step of the method for manufacturing the silicon carbide semiconductor device of FIG. 1.
Figure 15:
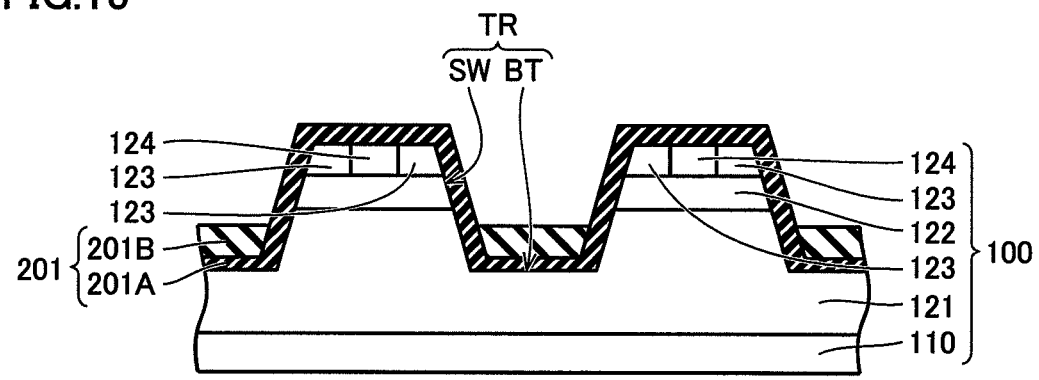
FIG. 15 is a partial cross sectional view schematically showing a tenth step of the method for manufacturing the silicon carbide semiconductor device of FIG. 1.

Further, trench insulating film 201A is a thermal oxidation film of silicon carbide of epitaxial substrate 100 (see FIG. 14 and FIG. 15). This makes the trench insulating film thin and smooth. Accordingly, the breakdown voltage of MOSFET 500 can be made larger.

Further, bottom insulating film 201B is made of silicon oxide. In this way, the breakdown voltage of MOSFET 500 can be made larger. Further, bottom insulating film 201B is silicon film 90, i.e., a thermal oxidation film of a film containing silicon and containing no carbon. In this way, the breakdown voltage of MOSFET 500 can be made larger.

When t2+t3>t1, the thickness of gate insulating film 201 can be made small on side wall SW whereas the thickness thereof can be made large on bottom portion BT. Accordingly, the breakdown voltage of MOSFET 500 can be made larger while making the threshold voltage small.

When t3>t2, a ratio of the portion formed of bottom insulating film 201B of gate insulating film 201 becomes large on bottom portion BT. Accordingly, the breakdown voltage of MOSFET 500 can be made larger.

When t2<t1, a region for providing bottom insulating film 201B is further secured on bottom portion BT. Accordingly, the breakdown voltage of MOSFET 500 can be made larger.

When t3>100 nm, the breakdown voltage of MOSFET 500 can be made larger.

When bottom insulating film 201B has a carbon atom concentration of less than $1 \times 10^{15}$ cm$^{-3}$, the carbon atom concentration of bottom insulating film 201B is sufficiently low. Accordingly, the breakdown voltage of MOSFET 500 can be made larger.

Figure 19:
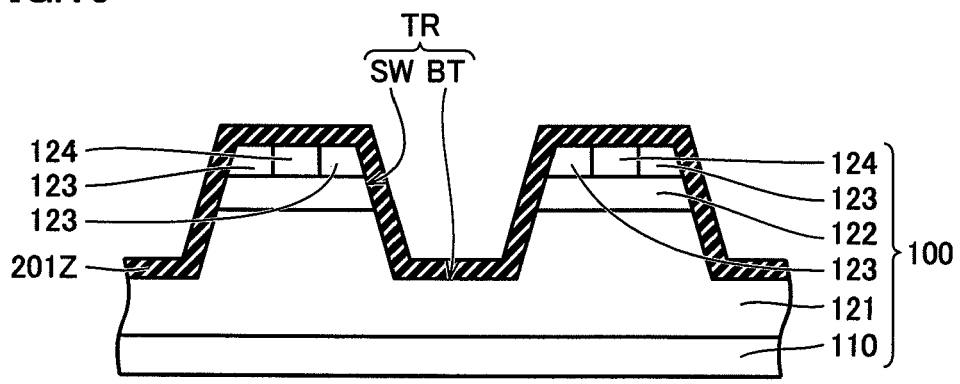
FIG. 19 is a partial cross sectional view schematically showing one step of a method for manufacturing a silicon carbide semiconductor device of a comparative example.

Further, according to the present embodiment, the decrease of carbon atom concentration NC in gate insulating film 201 just above bottom portion BT of trench TR (FIG. 5) is relatively gradual as indicated by arrow d1 (FIG. 5). Accordingly, generation of stress due to the composition change in gate insulating film 201 can be suppressed. In contrast, if a gate insulating film 201Z is formed by means of thermal oxidation of epitaxial substrate 100 without bottom insulating film 201B (FIG. 15) as shown in FIG. 19, carbon atom concentration NC is drastically decreased in gate insulating film 201Z just above bottom portion BT of trench TR as indicated by arrow d2 (FIG. 5). As a result, stress is likely to be applied to gate insulating film 201Z.

It should be noted that in the present embodiment, the silicon oxide film serving as bottom insulating film 201B (FIG. 14) is a silicon oxide film formed through the thermal oxidation of silicon film 90 (FIG. 13), but the silicon oxide film may be formed through, for example, the CVD method instead of forming silicon film 90. Further, the material of the bottom insulating film is not limited to silicon oxide, and may be phosphorus silicate glass or silicon nitride, for example. A film made of silicon nitride can be formed by means of, for example, the CVD method.

Further, the "first conductivity type" corresponds to n type conductivity, and the "second conductivity type" corresponds to p type conductivity, but these conductivity types may be replaced with each other. In this case, the donor and acceptor in the foregoing description are also replaced with each other. It should be noted that in order to attain higher channel mobility, it is preferable that the "first conductivity type" corresponds to n type conductivity. Further, the silicon carbide semiconductor device is not limited to the MOSFET, and may be a trench type IGBT (Insulated Gate Bipolar Transistor), for example.

Second Embodiment

Figure 20:
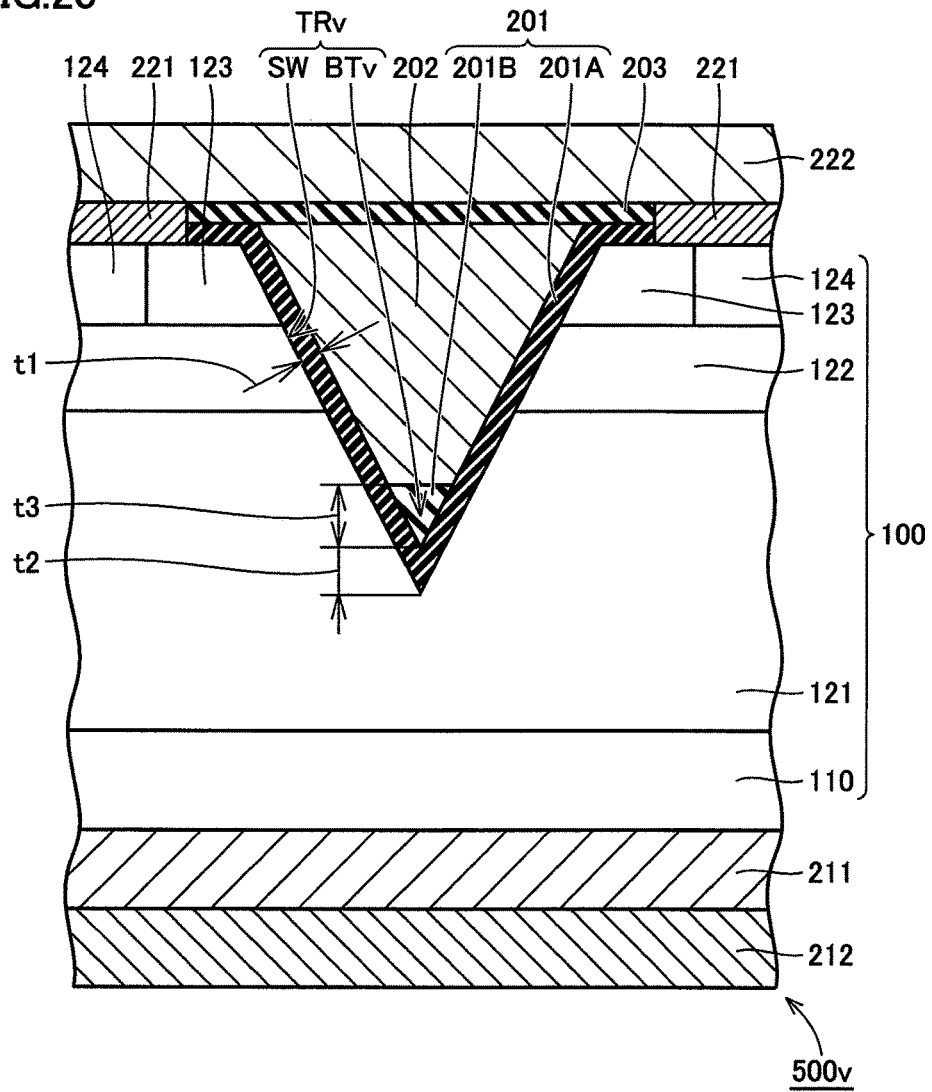
FIG. 20 is a partial cross sectional view schematically showing a configuration of a silicon carbide semiconductor device in a second embodiment of the present invention.

As shown in FIG. 20, a MOSFET 500v (silicon carbide semiconductor device) of the present embodiment has a trench TRv having a V shape instead of trench TR (FIG. 4). Trench TRv has a bottom portion BTv, instead of bottom portion BT (FIG. 4). When viewed in cross section (FIG. 20), bottom portion BTv is a portion in which side walls SW facing each other make contact with each other so as to form a V shape. Apart from the configuration described above, the configuration of the present embodiment is substantially the same as the configuration of the first embodiment. Hence, the same or corresponding elements are given the same reference characters and are not described repeatedly.

(Surface Having Special Plane)

Figure 21:
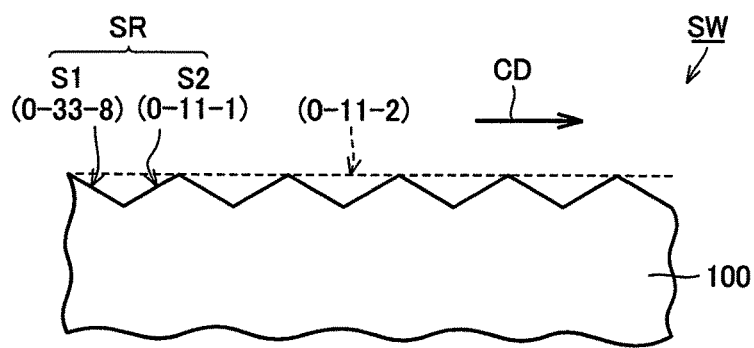
FIG. 21 is a partial cross sectional view schematically showing a fine structure in a surface of a silicon carbide substrate included in the silicon carbide semiconductor device.

As described above, side wall SW (FIG. 1) of trench TR preferably has a predetermined crystal plane (also referred to as "special plane") on, in particular, p type body layer 122. Such a side wall SW includes a plane S1 (first plane) having a plane orientation of {0-33-8} as shown in FIG. 21. Plane S1 preferably has a plane orientation of (0-33-8).

More preferably, side wall SW microscopically includes plane S1, and side wall SW microscopically further includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Preferably, plane S2 has a plane orientation of (0-11-1).

Preferably, plane S1 and plane S2 of side wall SW forms a combined plane SR having a plane orientation of {0-11-2}. Specifically, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

The following describes detailed structure of combined plane SR.

Figure 22:
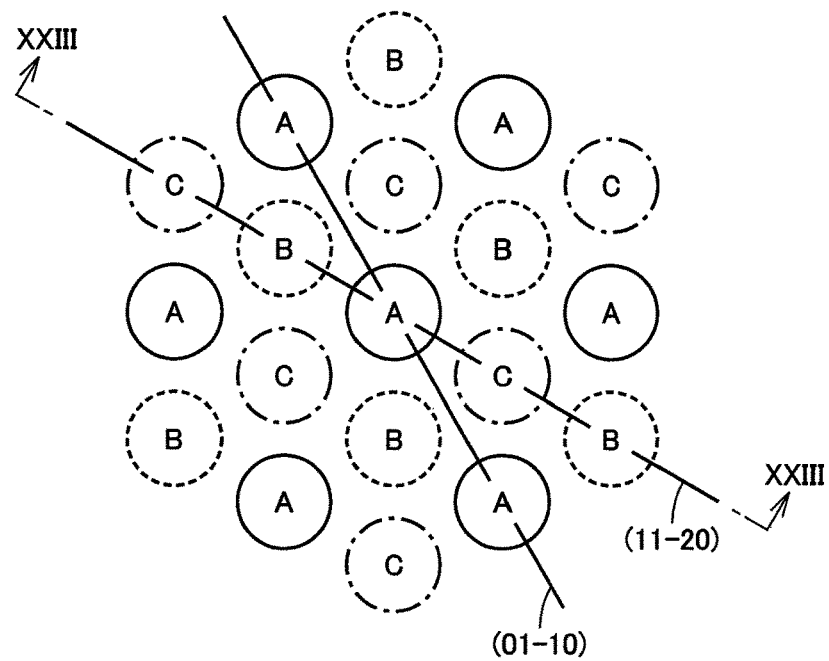
FIG. 22 shows a crystal structure of a (000-1) plane in a hexagonal crystal of polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 22. In other words, with four layers ABCB being regarded as one period, a periodic stacking structure such as ABCBABCBABCB . . . is provided.

Figure 23:
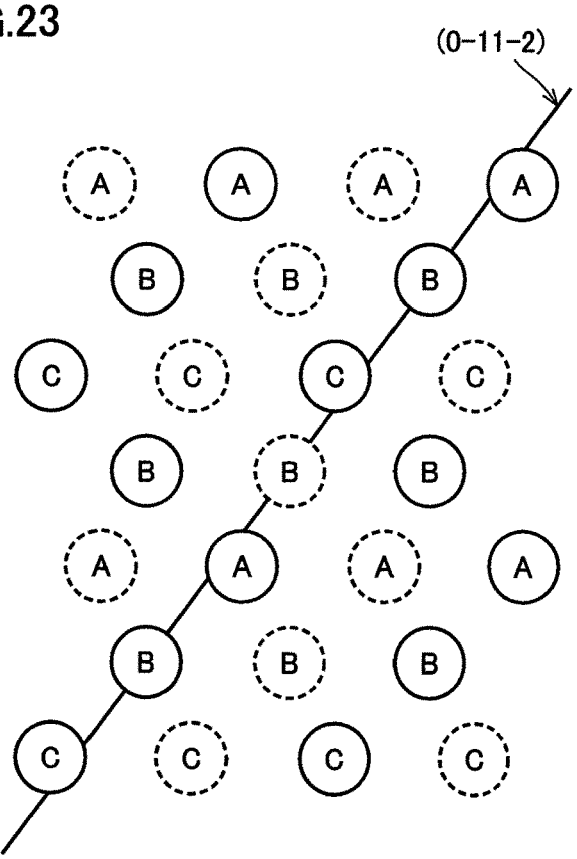
FIG. 23 shows a crystal structure of a (11-20) plane along a line XXIII-XXIII in FIG. 22.

As shown in FIG. 23, in the (11-20) plane (cross section taken along a line XXIII-XXIII of FIG. 22), atoms in each of four layers ABCB constituting the above-described one period are not aligned completely along the (0-11-2) plane. In FIG. 23, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 24:
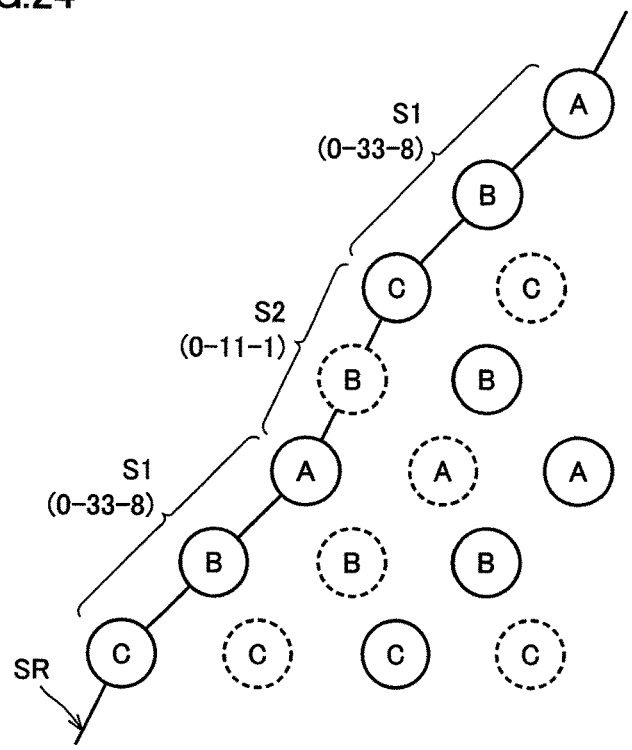
FIG. 24 shows a crystal structure of a combined plane of FIG. 21 in the vicinity of the surface within the (11-20) plane.

As shown in FIG. 24, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 23).

Figure 25:
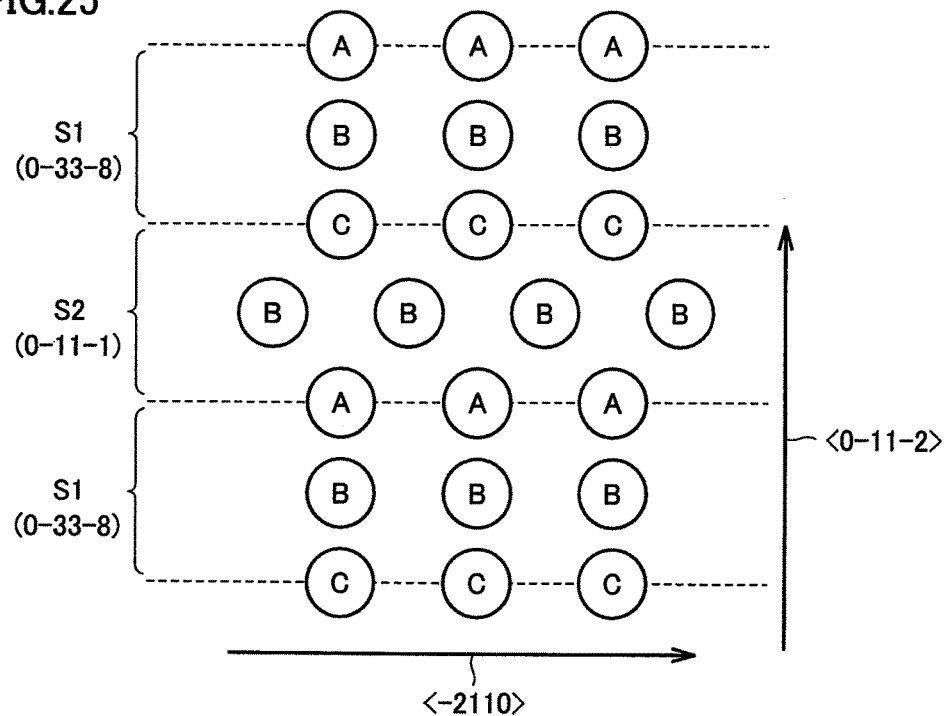
FIG. 25 shows the combined plane of FIG. 21 when viewed from a (01-10) plane.

As shown in FIG. 25, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be formed of the planes (planes S1 in FIG. 25) having a plane orientation of (001) in the structure equivalent to the cubic structure and the planes (planes S2 in FIG. 25) connected to the foregoing planes and having a plane orientation different from that of each of the foregoing planes. The polytype may be, for example, 6H or 15R.

Figure 26:
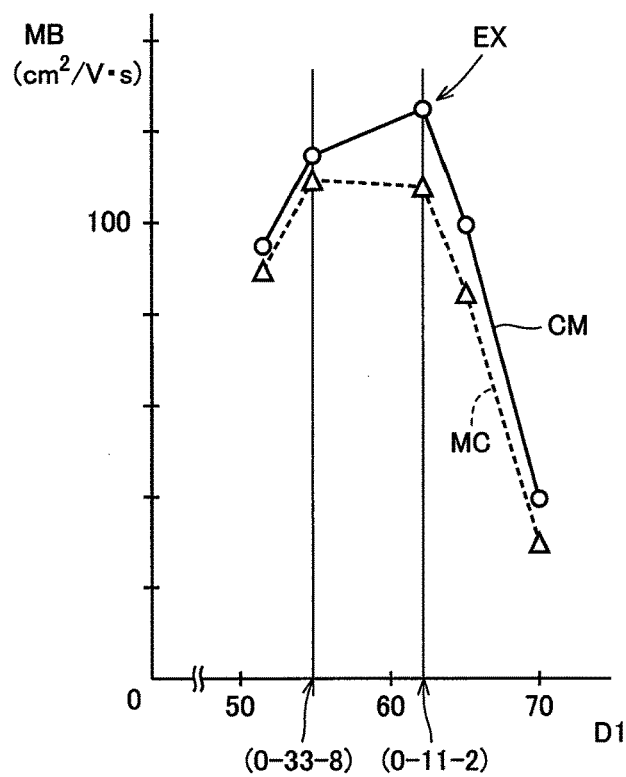
FIG. 26 is a graph showing an exemplary relation between channel mobility and an angle between a channel surface and the (000-1) plane when macroscopically viewed, in each of a case where thermal etching is performed and a case where no thermal etching is performed.

Referring to FIG. 26, the following describes a relation between the crystal plane of side wall SW and mobility MB of the channel surface. In the graph of FIG. 26, the horizontal axis represents an angle D1 formed by the (000-1) plane and the macroscopic plane orientation of side wall SW having the channel surface, whereas the vertical axis represents mobility MB. A group of plots CM correspond to a case where side wall SW is finished to correspond to a special plane by thermal etching, whereas a group of plots MC correspond to a case where side wall SW is not thermally etched.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 24 and FIG. 25, the multiplicity of planes S1 each having a plane orientation of (0-33-8) are densely and regularly arranged with planes S2 interposed therebetween, whereby a ratio of the microscopic plane orientation of (0-33-8) becomes high in the surface of the channel surface.

Figure 27:
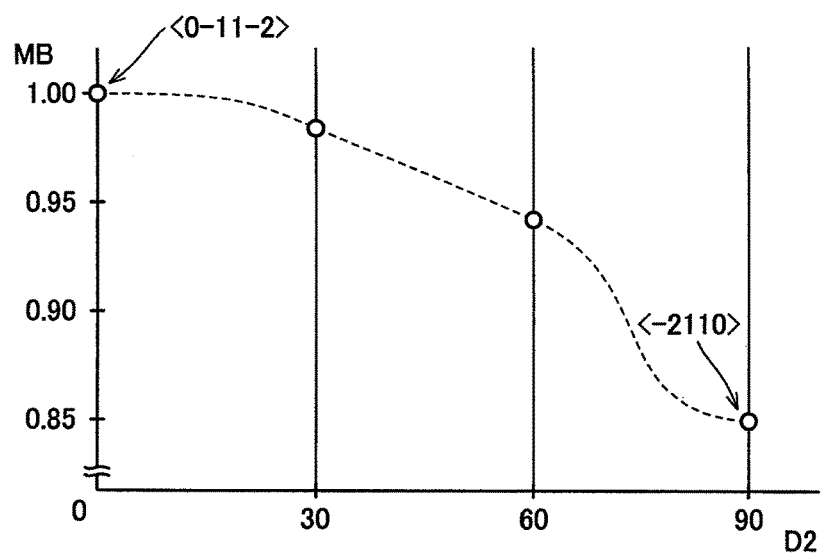
FIG. 27 is a graph showing an exemplary relation between the channel mobility and an angle between a channel direction and a <0-11-2> direction.

It should be noted that mobility MB has orientation dependency on combined plane SR. In a graph shown in FIG. 27, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 21) preferably has an angle D2 of not less than 0° and not more than 60°, more preferably, substantially 0°.

Figure 28:
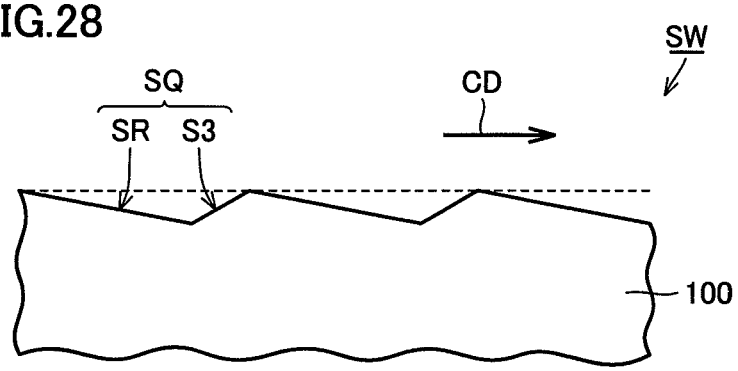
FIG. 28 shows a modification of FIG. 21.

As shown in FIG. 28, side wall SW may further include plane S3 (third plane) in addition to combined plane SR. More specifically, side wall SW may include a combined plane SQ formed of periodically repeated plane S3 and combined plane SR. In this case, the off angle of side wall SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by, for example, TEM or AFM.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device comprising the steps of:
    preparing a silicon carbide substrate having a silicon carbide layer;
    forming a trench at said silicon carbide layer;
    forming a bottom insulating film at a bottom portion of said trench;
    forming a trench insulating film under said bottom insulating film to cover said bottom portion and a side wall of said trench after forming said bottom insulating film;
    forming a gate electrode on said bottom insulating film on said trench insulating film, and
    wherein said trench insulating film is formed by thermally oxidizing said silicon carbide layer after forming said bottom insulating film.

2. The method for manufacturing a silicon carbide semiconductor device according to claim 1, said silicon carbide layer having a first conductivity type and further comprising a step of:
    forming an impurity region of a second conductivity type at said silicon carbide layer before forming said trench, wherein
    said trench is formed to penetrate said impurity region.

3. The method for manufacturing a silicon carbide semiconductor device according to claim 1, wherein
    said trench insulating film is formed at a first temperature higher than a second temperature at which said bottom insulating film is formed.

4. The method for manufacturing a silicon carbide semiconductor device according to claim 3, wherein
    said first temperature is 1300° C. or more and said second temperature is not less than 800° C. and not more than 950° C.

5. The method for manufacturing a silicon carbide semiconductor device according to claim 1, further comprising a step of:
    forming a silicon film on said bottom portion of said trench before forming said bottom insulating film, wherein
    said bottom insulating film is formed by thermally oxidizing said silicon film.

* * * * *